United States Patent [19]
Dunlap et al.

[11] Patent Number: 5,748,534
[45] Date of Patent: May 5, 1998

[54] FEEDBACK LOOP FOR READING THRESHOLD VOLTAGE

[75] Inventors: Frank M. Dunlap, Palo Alto; Hock C. So, Redwood City; Sau C. Wong, Hillsborough, all of Calif.

[73] Assignee: Invox Technology, Campbell, Calif.

[21] Appl. No.: 622,333

[22] Filed: Mar. 26, 1996

[51] Int. Cl.$^6$ ................................. G11C 11/34
[52] U.S. Cl. .................. 365/185.21; 365/207; 327/54
[58] Field of Search .................. 365/185.21, 207, 365/208; 327/51, 54

[56] References Cited

U.S. PATENT DOCUMENTS 5,339,272  8/1994  Tedrow et al. ................. 365/185.21

Primary Examiner—Joseph A. Popek
Assistant Examiner—Hoai Ho
Attorney, Agent, or Firm—Skjerven, Morrill, MacPherson, Franklin, and Friel LLP; David T. Millers

[57] ABSTRACT

To read the threshold voltage of a transistor such as a floating gate transistor in an analog or multi-level memory cell, the transistor is connected in a feedback loop which contains a differential amplifier having an output terminal and an input terminal respectively connected to the gate and a node (source or drain) of the transistor. A reference voltage is asserted to a second input terminal of the differential amplifier. A load provides a current which charges the node, and the differential amplifier adjusts the gate voltage of the memory cell to an equilibrium value where current through the transistor is equal to current through the reference cell. The equilibrium value of the gate voltage depends on and indicates the threshold voltage of the transistor. In one embodiment of the invention, the load is a current source which mirrors a current through a reference cell that is structurally identical to the transistor, and the drain of the reference cell provides the reference voltage to the amplifier.

19 Claims, 5 Drawing Sheets

5,748,534

FEEDBACK LOOP FOR READING THRESHOLD VOLTAGE

BACKGROUND OF THE INVENTION

1. Field of the Invention

This invention relates to circuits and methods for measuring the threshold voltage of a transistor and to circuits for reading analog and multi-level memory cells.

2. Description of Related Art

Many non-volatile memory cells contain floating gate transistors or MNOS transistors which have threshold voltages that are changed or set to indicate stored binary, multi-level, or analog values. For binary values, each memory cell stores a single bit of information which is "1" or "0" as indicated by the threshold voltage of the memory cell being higher or lower than a read voltage applied to the control gate of the memory cell during a read. For multi-level and analog values, the threshold voltage of each memory cell is set to one of a discrete set levels or to a level within a continuous range of possible threshold voltages. Reading a multi-level or analog memory cell measures the cell's threshold voltage or a derivative of the cell's threshold voltage, and converts the measurement to an output signal indicating a stored multi-bit value or analog value.

A primary concern when reading a multi-level or analog memory is accuracy. Unlike in binary memories where threshold voltages nominally have two states which are widely separated so that small inaccuracies in reading a cell do not affect the value ("1" or "0") read, an inaccurate read circuit results in changes or distortion in the output signal which may not be tolerable for an application. Accordingly, accurate circuits for reading the threshold voltage of memory cells are sought.

SUMMARY OF THE INVENTION

To read a threshold voltage of a transistor such as a floating gate transistor or MNOS transistor in an analog or multi-level memory cell, the transistor is connected in a feedback loop which contains an amplifier having an input terminal coupled to a node (source or drain) of the transistor and an output terminal coupled to the gate of the transistor. A load which may be a current source, a resistor, or a diode-connected device applies a current to the input terminal and the node of the transistor which charges both until an equilibrium is reached where the current to the node is equal to the current through the transistor. The threshold voltage of the transistor can be determined from the gate voltage (or gate-source voltage VGS) of the transistor, the current through the transistor, and the physical characteristics of the transistor.

In a memory array, each memory cell has the same physical characteristics but possibly has different threshold voltages caused by different stored charges. Applying the same equilibrium current to all memory cells when read provides equilibrium gate voltages which are linearly related to the threshold voltages of the memory cells, and such gate voltages provide values read from the memory cells. Alternatively, systematically applying a current which depends on the equilibrium gate voltage provides a gate voltage reading which directly indicates the relative magnitude of the threshold voltage of the memory cell.

In one embodiment of the invention, the current source applies a current to the drain of the transistor. The current source contains a current mirror which sets the equilibrium current through the transistor equal to a current through a reference cell which is substantially identical to the transistor. Additionally, the amplifier is a differential amplifier having a positive input terminal coupled to the current source and a negative input terminal coupled to the drain of the reference cell. A current through the reference cell creates a current to the drain of the transistor and the positive input terminal which increases the voltage at the positive input terminal of the differential amplifier until the output voltage from the differential amplifier causes the transistor to conduct a current equal to the current through the reference cell. The equilibrium gate voltage of the transistor differs from the threshold voltage of the transistor by the same amount that a reference voltage applied to the gate of the reference cell differs from the threshold voltage of the reference cell. Accordingly, the threshold voltage of the transistor can be determined from the equilibrium gate voltage of the transistor, the reference voltage, and the threshold voltage of the reference cell.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1A:
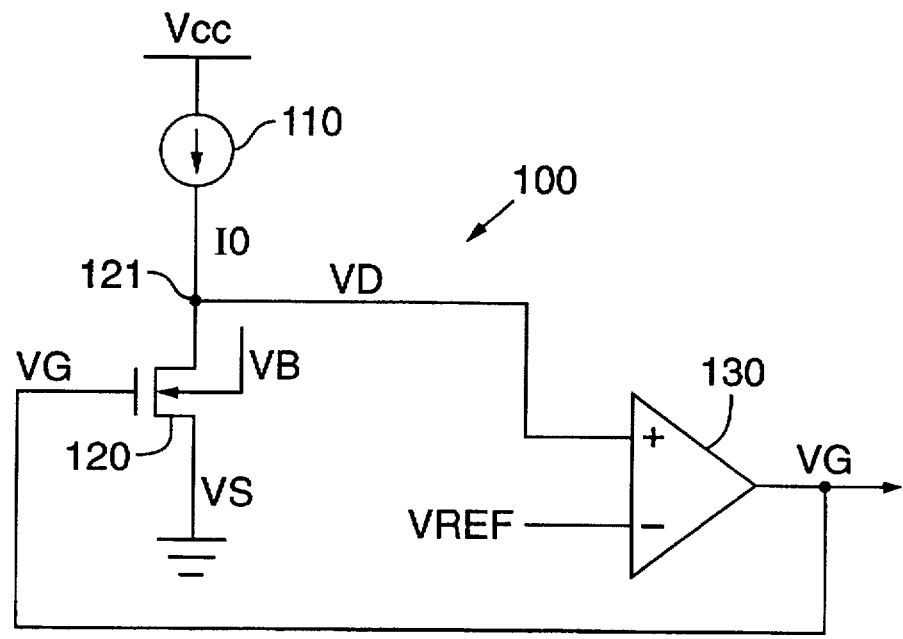
FIGS. 1A, 1B, 1C, and 1D show embodiments of the invention including feedback loops for measuring threshold voltages.

Embodiments of the invention read the threshold voltages (or derivatives thereof) from a variety of devices. FIG. 1A shows an embodiment of the invention which uses a feedback loop 100 to read the threshold voltage of a transistor 120 which may be, for example, an N-channel field effect transistor or floating gate transistor or any device which provides negative feedback around loop 100. In feedback loop 100, a positive input terminal of a differential amplifier 130 is coupled to a node 121 of transistor 120 and an output terminal of differential amplifier 130 is coupled to the gate (or control gate) of transistor 120. Node 121 is the source or drain of transistor 120 depending on the type of transistor 120. In the following, node 121 is assumed to be the drain of transistor 120 which is the case if transistor 120 is a conventional N-channel enhancement mode device.

To measure the threshold voltage of transistor 120, a load 110 is connected to node 121, and a negative input terminal of differential amplifier 130 is connected to a reference voltage VREF. Load 110 may be a resistor, a current source, a diode-connected device, or any device which supplies a current I0 to node 121. When the source of transistor 120 is grounded and a gate voltage VG of transistor 120 is less than the threshold voltage of transistor 120, transistor 120 is off, and current I0 increases a voltage VD at the positive input terminal of differential amplifier 130. After a period of time, voltage VD increases to just past voltage VREF, and differential amplifier 130 generates a gate voltage VG of transistor 120 higher than the threshold voltage of transistor 120. Transistor 120 conducts, and an equilibrium gate voltage VG is reached where current IDS through transistor 120 is equal to current I0 and voltage VD is about equal to reference voltage VREF. If gate voltage VG increases past the equilibrium level, conductivity of transistor 120 increases and reduces voltage VD which in turn reduces voltage VG. Accordingly, feedback loop has negative feedback which provides a stable equilibrium.

In equilibrium, most of the voltages and currents applied to transistor 120 are known quantities and are independent of the threshold voltage of transistor 120. Current IDS through transistor 120 is equal to the current I0, assuming that current to amplifier 130, source and drain currents IBS and IDB to a body containing transistor 120, and current IG through the gate of transistor 120 are zero. Current IDS is known from the properties of load 110 because at the equilibrium point voltages Vcc and VD at both ends of load 110 are known. Feedback loop 100 controls drain voltage VD at node 121 and forces voltage VD to be about equal to voltage VREF. The source and body voltages VS and VB are approximately zero because the source and body are shorted to grounded. (The body-source voltage VBS actually depends on parasitic resistances and current IDS which are nearly independent of the threshold voltage.)

The equilibrium gate voltage VG, which differential amplifier 130 sets at a level to provide the desired current IDS, exhibits a linear dependence on the threshold voltage of transistor 120 and can be sampled to read transistor 120. The threshold voltage of transistor 120 can then be determined from the sampled gate voltage VG and fixed quantities such as current IDS through transistor 120, the drain, source, and body voltages VD, VS, and VB of transistor 120, and the physical characteristics of transistor 120. However, current IDS, voltages VD, VS, and VB, and the physical characteristics of the transistor need not be known to determine relative threshold voltages of two transistors. If an equilibrium gate voltage VG for transistor 120 is greater or less than the equilibrium gate voltage for a second transistor connected in place of transistor 120, the threshold voltage for transistor 120 is similarly greater or less than the threshold voltage for a second transistor.

Figure 1B:
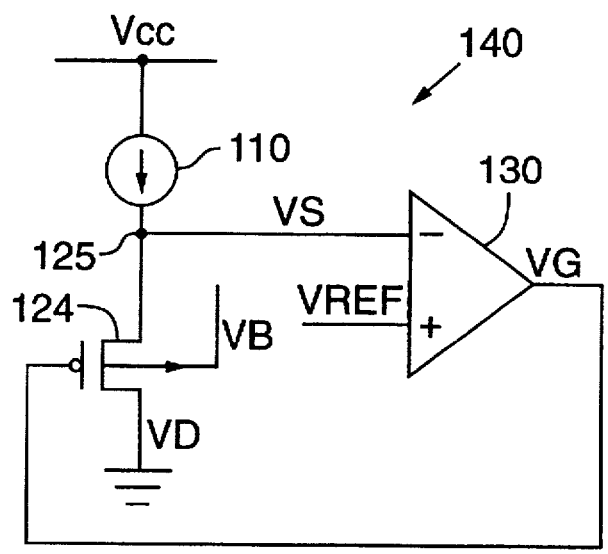

Feedback loops in accordance with the invention also measure threshold voltages of P-channel devices. For example, as shown in FIG. 1B, interchanging positive and negative input terminals of differential amplifier 130 creates a feedback loop 140 which has negative feedback for a P-channel transistor 124. When a voltage VS on the negative input terminal of differential amplifier 130 is less than the reference voltage VREF applied to the positive input terminal of differential amplifier 130, gate voltage VG output from amplifier 130 is high (greater than the maximum possible threshold voltage) and turns off transistor 124. Current through load 110 charges the negative input terminal of differential amplifier 130 and a node (source) 125 of transistor 124 until voltage VS is about equal to reference voltage VREF and gate voltage VG drops to turn on a current IDS through transistor 124. An equilibrium is reached where current IDS through transistor 124 is equal to current applied to node 125. In equilibrium, the current IDS and terminal voltages VS and VD applied to transistor 124 are nearly independent of the threshold voltage of transistor 124, and the gate-source voltage VGS of transistor 124 is directly related to the threshold voltage.

Voltage VG in feedback loop 140 can be sampled to read transistor 124. A potential problem with using voltage VG from feedback loop 140 is that the threshold voltage depends on gate-source voltage VGS which is the difference between voltages VG and VS. Voltage VS may have noise for which measurements based on VG alone do not compensate. Additionally, a body effect arises if the body of transistor 124 is at a potential VB that differs from source voltage VS.

Figure 1C:
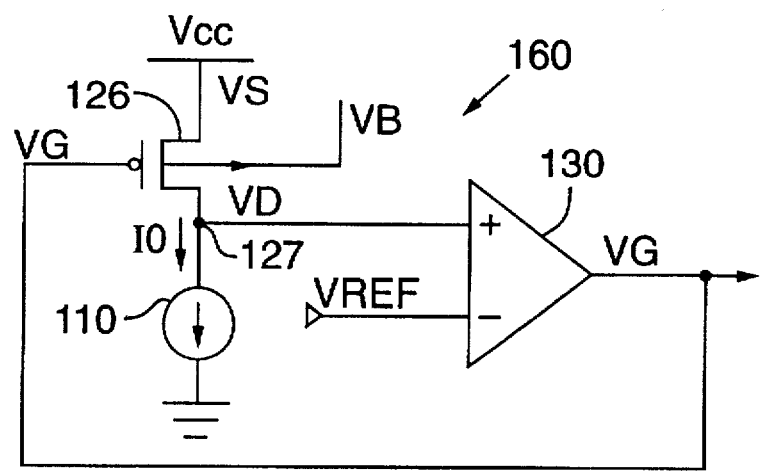

FIG. 1C shows another feedback loop 160 which measures the negative threshold voltage of a P-channel transistor 126. In feedback loop 160, the positive input terminal of amplifier 130 is coupled to a node 127 which is between transistor 126 and load 110; and load 110 is connected between transistor 126 and ground. Node 127 is the drain of P-channel transistor 126. When voltage VG is less than voltage Vcc by much more than the threshold voltage of transistor 126, transistor 126 is fully on and charges node 127. Load 110 is selected so that when transistor 126 is fully on node 127 rises until voltage VD is about equal to voltage VREF. Amplifier 130 increases voltage VG to begin shutting off transistor 126 when voltage VD is greater than reference voltage VREF. In equilibrium, current through transistor 126 is equal to current I0 through load 110, and the difference (VG−Vcc) between gate voltage VG and a supply voltage Vcc is directly related to the threshold voltage of transistor 126. Gate voltage VG is also directly related to the threshold voltage of transistor 126.

Figure 1D:
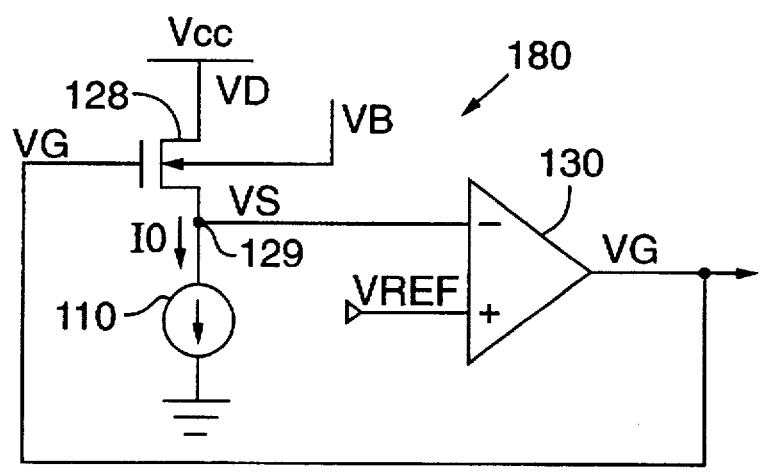

Swapping the negative and positive inputs of differential amplifier 130 in feedback loop 160 creates a feedback loop 180 (FIG. 1D) which measures the threshold voltages of an N-channel transistor 128. With transistor 128 initially on, voltage VS increases and moves toward an equilibrium where voltage VS is about equal to voltage VREF, and current IDS through transistor 128 drops until it is equal to current I0 through load 110. The threshold voltage of transistor 128 is related to the gate-source voltage VGS which is the difference (VG−VS). Since the source voltage is a constant about equal to reference voltage VREF, the gate voltage is directly related to the threshold voltage. Feedback loop 180 is similar to feedback loop 140 in that noise in source voltage VS and a body effect can affect the accuracy of threshold voltage readings based on voltage VG alone.

Figure 2:
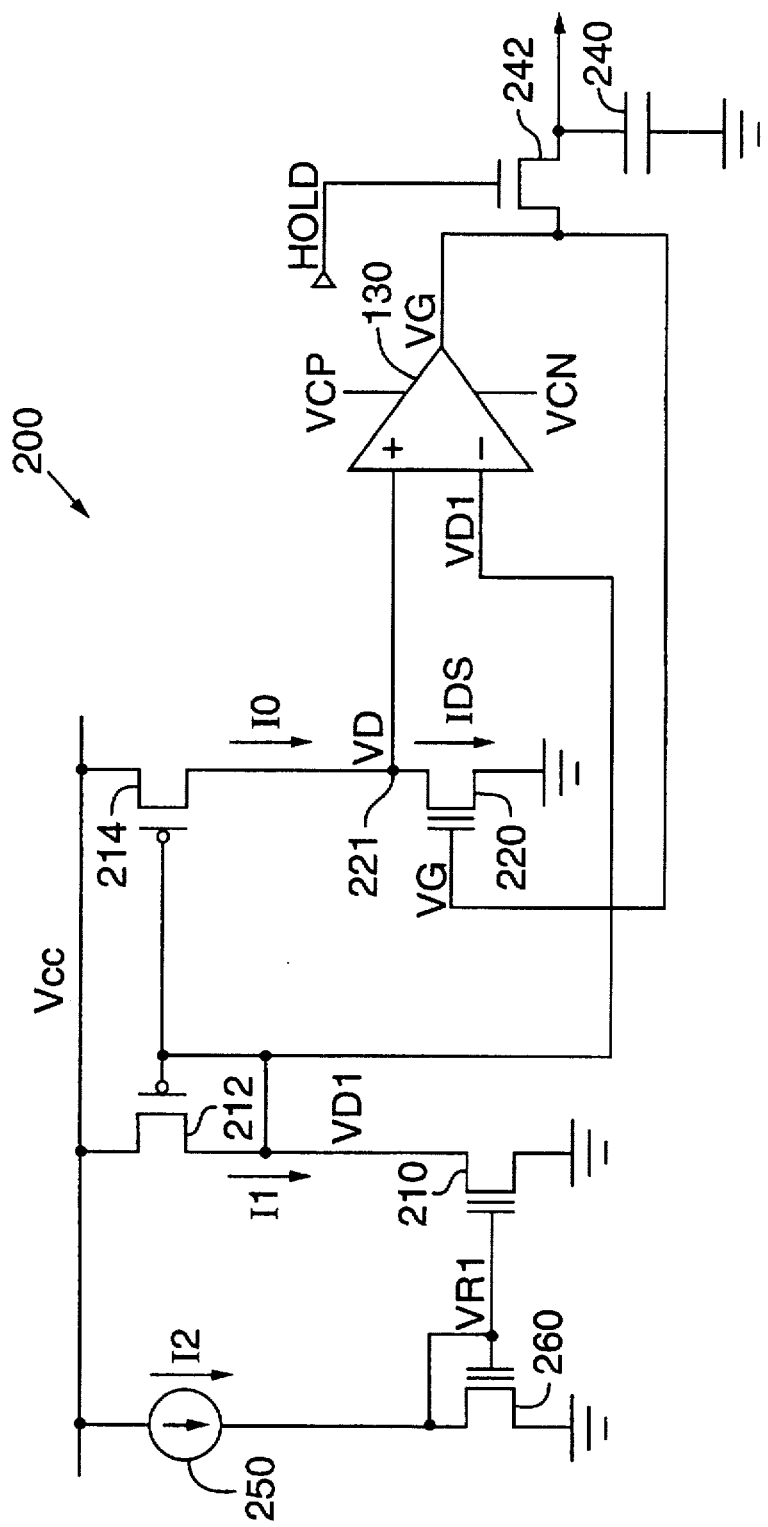
FIG. 2 shows an embodiment of the invention where a feedback loop reads a threshold voltage of a floating gate transistor.

FIG. 2 shows an embodiment of a feedback loop 200 for measuring a threshold voltage of an N-channel floating gate transistor 220. Feedback loop 200 contains a high gain differential amplifier 130 having a positive input terminal and an output terminal respectively coupled to a drain 221 and a control gate of floating gate transistor 220. Also, coupled to drain 221 is a current source which includes a P-channel transistor 214 coupled between floating gate transistor 220 and a supply voltage Vcc. The current source also contains a reference transistor 210 which is structurally identical to floating gate transistor 220 and a P-channel transistor 212 which is structurally identical to transistor 214. Transistors 210 and 212 are connected in series between supply voltage Vcc and ground, and the gate and drain of transistor 212 are connected together and to the gate of transistor 214 to form a current mirror.

Reference transistor 210 provides a reference voltage VD1 to the negative input terminal of differential amplifier 130 during measurement of the threshold voltage of transistor 220. In one embodiment, transistor 210 is an unprogrammed floating gate transistor having an uncharged floating gate and a known threshold voltage, i.e. the minimum possible threshold voltage for transistors having the same structure as floating gate transistors 210 and 220. Using unprogrammed reference cells provides a threshold voltage which is known and is simple to restore if necessary. However, in alternative embodiments, reference cell 210 can be programmed to any threshold voltage.

A reference voltage VR1, which is above the threshold voltage of transistor 210 by a known amount, is applied to the control gate of transistor 210 so that transistor 210 conducts and a current I1 flows through transistors 212 and 210. A constant current source 250 and a second reference transistor 260 which has gate and drain connected to the gate of reference transistor 210 control reference voltage VR1. Basing voltage VR1 on a fixed current through reference transistor 260, provides an overdrive to reference transistor 210 that tracks process variations. Alternatively, a bandgap generator can generate reference voltage VR1.

Differential amplifier 130 has a high gain and adjusts voltage VG to keep a voltage VD (on the positive input terminal of amplifier 130) about equal to voltage VD1 (on the negative input terminal of amplifier 130) when equilibrium is reached. In equilibrium, current I1 through transistor 212 is equal to current IDS through transistor 214, and voltage VG is greater than the threshold voltage of transistor 220 by the same amount that voltage VR1 is greater than the threshold voltage of transistor 210.

A switch 242 and a capacitance 240 are coupled to feedback loop 200. Turning on switch 242, applying voltage VR1 to transistor 210, and connecting transistor 214 to transistor 220 begins a read process. Current I0 charges the drain 221 of transistor 220, and amplifier 130 charges capacitance 240 and the gate of transistor 220 moving voltage VG up to the equilibrium gate voltage. After an allotted read time, a signal HOLD is asserted low to turn off switch 242 and disconnect capacitance 240 from feedback loop 200. Capacitance 240 then holds a voltage VG which indicates the threshold voltage of transistor 220.

Figure 3:
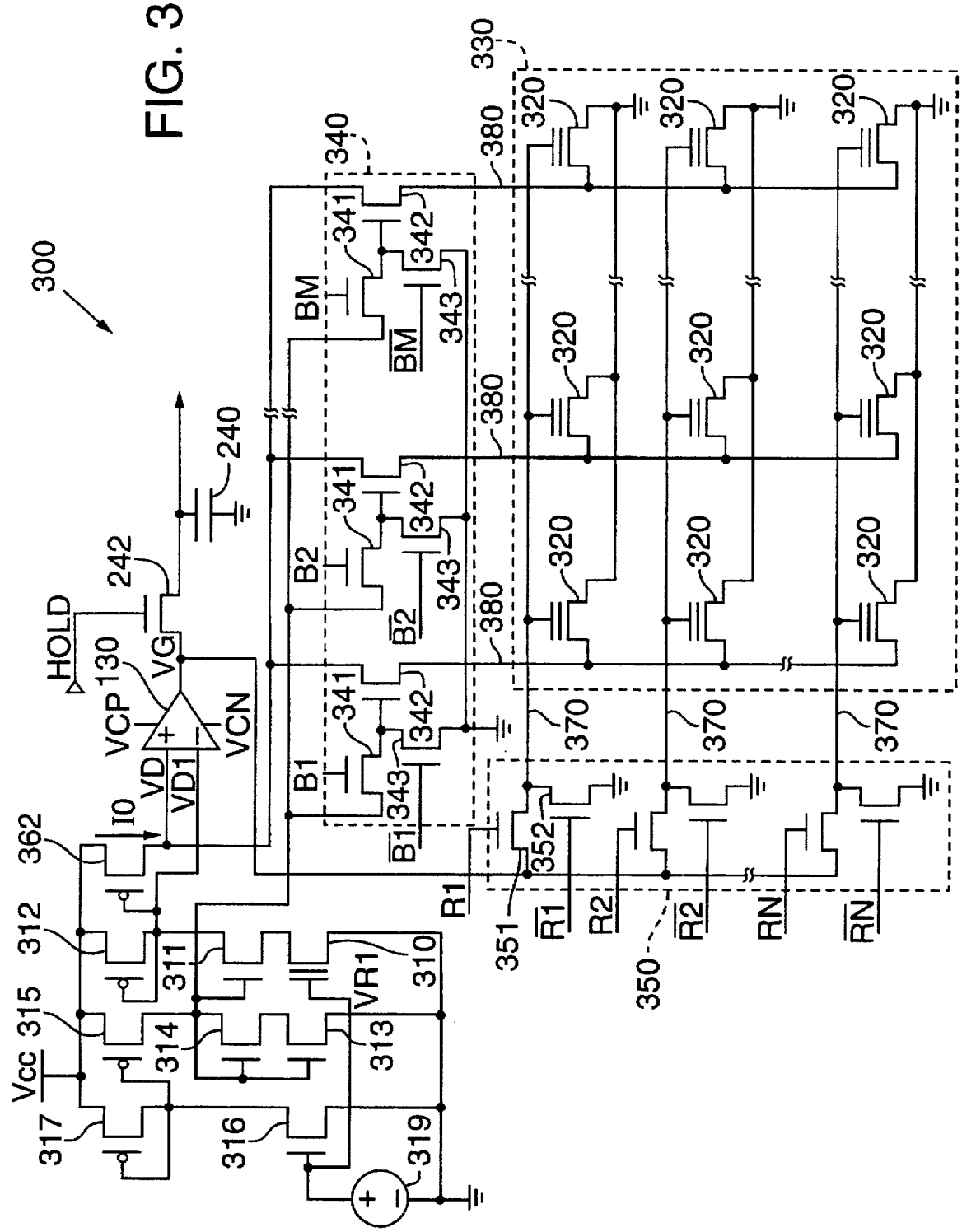
FIG. 3 shows an embodiment of a memory in accordance with the invention.

FIG. 3 shows a portion of a memory 300 in which a an array 330 of memory cells 320 stores analog or multi-level values with each value being indicated by a threshold voltage of a memory cell. Each memory cell 320 can be a floating gate transistor, a metal nitride oxide silicon (MNOS) transistor, or a split gate memory cell having a single accessible gate voltage and a threshold voltage which indicates a value stored. Alternative embodiments of the invention employ multiple transistor memory cells which have separate select gates and control gate voltages.

Array 330 typically includes hundreds or thousands of rows and columns of memory cells 320. To access a selected memory cell, address decoding circuitry (not shown) asserts the one of row selection signals R1 to RN which corresponds to a selected row containing the selected cell and asserts the one of column selection signals B1 to BM which corresponds to a selected column containing the selected cell. Signals $\overline{R1}$ to $\overline{RN}$ and $\overline{B1}$ to $\overline{BM}$ are complementary to signals R1 to RN and B1 to BM. The asserted one of signals R1 to RN turns on a corresponding transistor 351 in a row decoder 350 which connects a selected one of word lines 370 to an output terminal of a differential amplifier 130. Unselected rows have word lines grounded through associated transistors 352.

A column decoder 340 includes three transistors 341, 342, and 343 per column of memory array 330. For unselected columns, transistors 341 are off, and transistors 343 are on. Transistors 343 connect the gates of associated transistors 342 to ground, shutting off transistors 342 and disconnecting unselected bit lines from differential amplifier 130. The asserted one of signals B1 to BM turns on a transistor 341 for a selected bit line. This transistor 341 applies a voltage to the gate of the associated transistor 342 so that a current flows through transistors 362 and 342 to the selected bit line. The current charges the selected bit line and a positive input terminal of differential amplifier 130. After the allotted read time, a gate voltage VG is reached at which the selected memory cell conducts a current about equal to the current through transistor 362. This gate voltage provides the value read from the selected memory cell and directly depends on the threshold voltage of the selected memory cell.

A typical application for memory 300 is storage of samples which represent a sound (voice or music). Sound samples are recorded one sample per memory cell and played at a sampling rate which depends on the desired quality of sound reproduction. The available read time depends on the rate at which samples must be read, i.e. the sampling rate. For typical voice playback, a sampling rate of about 8 kHz provides adequate quality sound and a read time of about 125 µs (assuming only one read circuit is used). For CD-quality sound, a sampling rate of about 44 kHz is common and provides a maximum read time of about of 22.7 µs (again assuming only one read circuit is used). The gate voltage VG must settle within the available read time. Accordingly, the read circuitry must charge the bit line and word line for the selected cell up to the equilibrium voltages VD and VG within the available read time. Increasing power (i.e. current I0 and the current from amplifier 130) increases the speed at which equilibrium is reached. However, the architecture of memory 300, in particular impedance in bit lines, word lines, and decoding circuitry, provides a minimum RC constant which restricts how quickly bit lines or word lines charge. To simplify creation of a stable equilibrium with sufficient damping of oscillations about the equilibrium, impedance of capacitor 240 and resistance of amplifier 130 are selected to dominate the impedance of other nodes in the feedback loop. The time to charge capacitor 240 further increases the required read time. If the available read time is insufficient for a gate voltage rise to settle within a desired accuracy of its equilibrium value, the available read time can be effectively doubled using two memory segments and two read circuit (feedback loops) which operate in parallel or in a pipeline fashion. U.S. patent application Ser. No. 08/587,310, entitled "Pipelined Record and Playback for Analog Non-volatile Memory", by Sau C. Wong and Hock C. So, filed Jan. 12, 1996 describes systems which use pipelined playback and is incorporated by reference herein in its entirety.

A high gain, typically 60 dB or more, and low DC input current are desired for differential amplifier 130. The accuracy of a read depends on the loop gain which is the product of the gain of amplifier 130 and any gains that result from changing gate, source, and drain voltages of decoding transistors and floating gate memory transistors around the feedback loop. A high loop gain which keeps voltage VD and VD1 nearly equal when gate voltage VG is sampled improves the accuracy of the read. The gain of differential amplifier 130 must be high enough to compensate for any gains in the feedback loop which are less than 1 and provide a loop gain which meets the read accuracy requirements of memory 300. The low input current for amplifier 130 is desired so that the current through transistor 362 flows predominantly through the selected memory cell. A low input current can be achieved using a MOSFET input stage in differential amplifier 130. For example, a folded cascode MOSFET amplifier requires practically no DC input current.

A folded cascode MOSFET amplifier also provides a high output impedance. To improve loop stability, the output impedance of differential amplifier 130 and the impedance of capacitor 240 are selected to dominate capacitance and resistance in the rest of the loop in order to improve loop stability. Otherwise, resistance and capacitance in bit lines and word lines in the feedback loop could result in instability and oscillations in voltages VD and VG which may not damp fast enough to provide an accurate reading.

Amplifier 130 has an output voltage range that cover the range from the lowest to the highest possible threshold voltage which may be read. Accordingly, amplifier 130 uses a positive power supply voltage VCP that is greater than the highest possible threshold voltage and a negative power supply voltage VCN that is less than the lowest possible threshold voltage. In a typical application, the maximum threshold voltage for a memory cell is about 5 V, and voltage VCP may be about 6 V. A charge pump can generate voltage VCP from supply voltage Vcc to power amplifier 130 if voltage VCP is greater than supply voltage Vcc.

Transistors 342 (of the selected column) and 362 are connected to mirror the current through a reference cell 310 when equilibrium is reach. Reference cell 310 and transistors 311 and 312 are connected in series between supply voltage Vcc and ground. A reference generator 319 provides a gate voltage VR1 to reference cell 310 so that reference cell 310 conducts. Reference generator 319 and transistors 313 to 317 also bias the gate of transistor 311 so that transistor 311 conducts and acts as a cascading device to limit the drain-source voltage of transistor 310. P-channel transistor 317 and N-channel transistor 316 are connected in series between Vcc and ground and the gate of transistor 316 is coupled to reference generator 319 so that a current flows through transistors 317 and 316. Transistors 313 to 315 are connected in series between supply voltage Vcc and ground, and the gate of P-channel transistor 315 is connected to the gate and drain of P-channel transistor 317 so that current through transistor 317 controls current through transistor 315. The gate and drain of N-channel transistor 314 are coupled to the gate of N-channel transistor 311 so that transistor 311 conducts and the current through transistor 314 controls the resistance of transistor 311.

Transistor 362 is structurally identical to transistor 312 and has its gate coupled to the gate and drain of a transistor 312. The selected transistor 342 is structurally identical to transistor 311 and has its gate coupled to the gate of a transistor 311. In equilibrium, the current through transistors 362, 342, and the selected memory cell 320 mirrors the current through transistors 312, 311, and reference cell 310; and the gate voltage VG of the selected memory cell differs from the threshold voltage of the selected cell by the same amount that reference voltage VR1 differs from the threshold voltage of reference cell 310.

In one embodiment of the invention, reference cell 310 is formed in the same area as array 330 as part of a column which is disconnected from memory cells 320 to avoid stress during programming. Reference cell 310 is therefore subject to the same process variations as memory cells 320 in array 330 but has a constant threshold voltage of an unprogrammed, undisturbed cell. Reference generator 319 may be a bandgap generator which provides reference voltage VR1 at a constant level with little noise or fluctuations. Accordingly, provided that the read process is given enough time to reach equilibrium, the voltage VG provides a reading that differs from the threshold voltage of a memory cell being read by a fixed offset that is resistant to noise or fluctuations.

If desired, a voltage shifter can remove the fixed offset to generate a voltage equal to the threshold voltage of the cell being read. Alternatively, a process for writing to a selected memory cell 320 in memory 300 periodically reads the selected memory cell 320 during the write process and compares an output gate voltage read with an input analog voltage to be stored. The write process is complete when the write circuit verifies that the equilibrium gate voltage read from the selected cell is equal to the input analog voltage. When the memory cell is later read, the equilibrium gate voltage indicates the value stored, and no shift circuit or conversion is required to compensate for a difference between the gate voltage and a threshold voltage. Scaling or shifting may be required to convert from the range of stored values to a desired range of output voltages.

Figure 4:
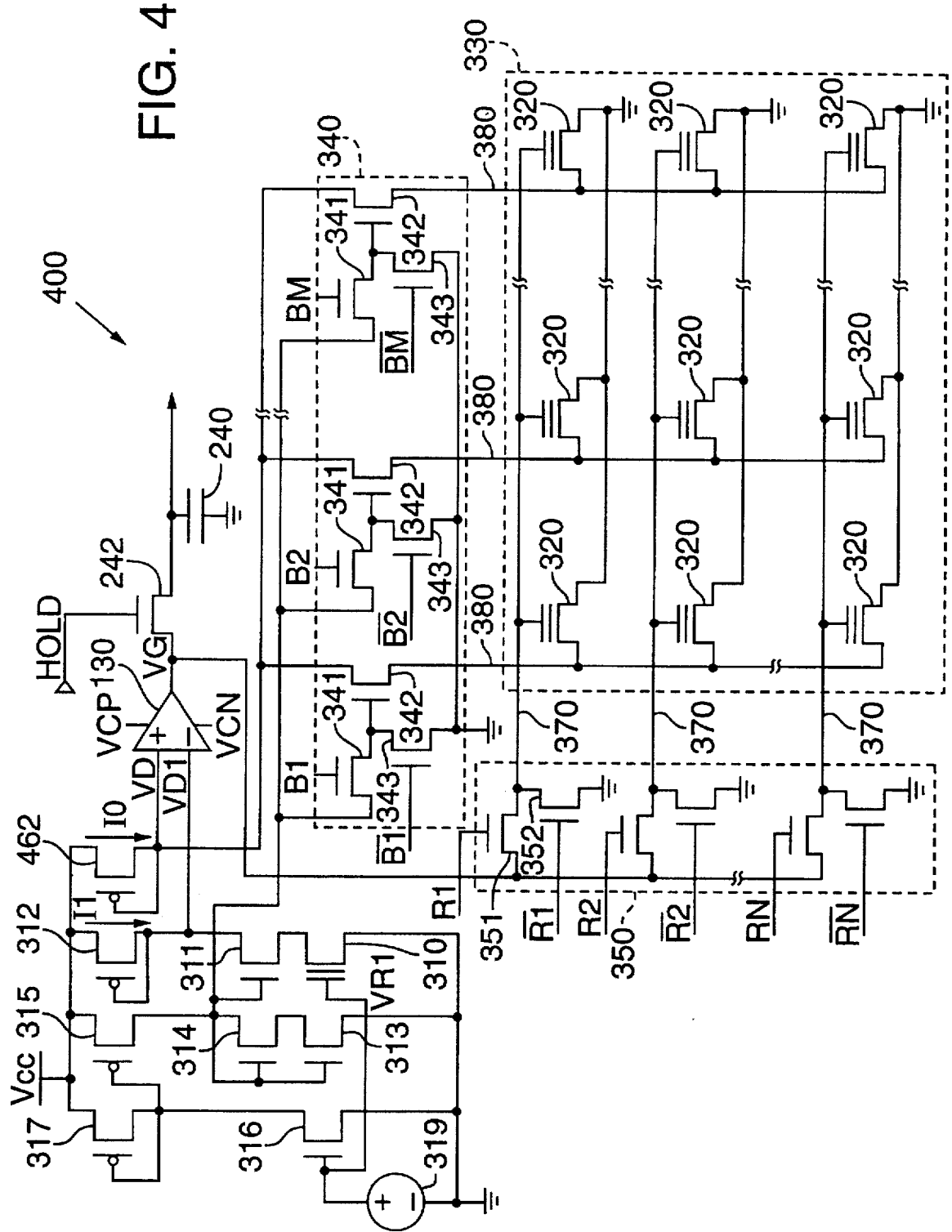
FIG. 4 shows an embodiment of another memory in accordance with the invention.

FIG. 4 shows portions of a memory 400 which is similar to memory 300 and contains elements which are described above in regard to FIG. 3. One difference between memory 400 and memory 300 is a transistor 462 which replaces transistor 362 of memory 300 and is diode-connected, i.e. has its gate and drain connected together, and is not directly connected to mirror the current through transistor 312. However, transistor 462 is structurally identical to transistor 312 and carries an current I0 which in equilibrium is about equal to a current I1 through a transistor 312 because a feedback loop in memory 400 keeps voltage VD at the drain and gate of transistor 462 about equal to voltage VD1 at the drain and gate of transistor 312. The source voltage of both transistors 312 and 462 is the supply voltage Vcc. Using transistor 462 which is diode-connected reduces the impedance on positive input terminal of amplifier 130 and improves feedback loop stability.

In an alternative embodiment of the invention, diode-connected transistors 312 and 462 can be replace by matching resistors.

Although the present invention has been described with reference to particular embodiments, the description is only an example of the invention's application and should not be taken as a limitation. In particular, the embodiment of the invention described in regard to FIG. 3 employs a read circuit having a feedback loop which, like feedback loop 100 of FIG. 1A, has a positive input terminal of an amplifier 130 connected to a drain of a transistor being read. Other embodiments of the invention employ feedback loops such as those shown in FIGS. 1B, 1C, and 1D in the read circuit of a memory. Additionally, although the particular application of storing sound samples is described, embodiments of the invention are more generally applicable to many uses including general data storage and in neural-networks. Various other adaptations and combinations of features of the embodiments disclosed are within the scope of the present invention as defined by the following claims.

We claim:

1. A read circuit, comprising:

an amplifier;

means for connecting a node of a selected memory cell to an input terminal of the amplifier;

means for applying a current to the input terminal of the amplifier, the means for applying comprising:
   a first transistor coupled between a supply voltage and the input terminal;
   a second transistor having a gate and a drain coupled together and to the gate of the first transistor; and
   a reference cell coupled in series with the second transistor between the supply voltage and ground; and means for connecting an output terminal of the amplifier to a gate of the selected memory cell, wherein an output voltage of the amplifier, that is provided while the output terminal is connected to the gate and the input terminal is connected to the node, indicates a data value stored in the selected memory cell.

2. The read circuit of claim 1, wherein connecting the output terminal of the amplifier to the gate of the selected memory cell and connecting the node of the selected memory cell to the input terminal of the amplifier creates a feedback loop having negative feedback.

3. The read circuit of claim 1, wherein the amplifier comprises a differential amplifier having a second input terminal in addition to the first-mentioned input terminal, the second input terminal being coupled to a reference voltage.

4. The read circuit of claim 1, wherein the reference cell is structurally identical to the selected memory cell.

5. The read circuit of claim 1, wherein the node is a drain of a floating gate transistor in the selected memory cell.

6. The read circuit of claim 1, wherein the node is a drain of a metal nitride oxide transistor in the selected memory cell.

7. A memory, comprising:

an amplifier;

a load coupled between an input terminal of the amplifier and a constant voltage terminal;

an array of memory cells;

a column decoder adapted to connect a node of a selected memory cell in the array to the input terminal of the amplifier; and a row decoder adapted to connect an output terminal of the amplifier to a gate of the selected memory cell, wherein an output voltage from the amplifier, provided while the output terminal is connected to the gate of the selected memory cell and the input terminal is connected to the node of the selected memory cell, indicates a data value stored in the selected memory cell.

8. The memory of claim 7, wherein the load comprises a current source coupled to an input terminal of the amplifier.

9. The memory of claim 7, wherein the load comprises a diode-connected device coupled to an input terminal of the amplifier.

10. The memory of claim 7, wherein the load comprises a resistor coupled to an input terminal of the amplifier.

11. The memory of claim 7, wherein the amplifier is a differential amplifier having a first input terminal and a second input terminal, wherein the first input terminal is the input terminal to which the load is coupled and a reference voltage is applied to the second input terminal.

12. The memory of claim 11, wherein the first input terminal is a positive input terminal, the second input terminal is a negative input terminal, and the column decoder connects a drain of the selected memory cell to the first input terminal.

13. A method for reading the threshold voltage of a transistor, comprising:

connecting a node of the transistor to a first input terminal of a differential amplifier;

connecting an output terminal of the differential amplifier to a gate of the transistor;

applying a reference voltage to a second input terminal of the differential amplifier;

applying a current to the node; and determining the threshold voltage of the transistor from a voltage on gate of the transistor.

14. The method of claim 13, wherein determining the threshold voltage comprises waiting until a current through the transistor settles to an approximately constant level.

15. The method of claim 13, wherein applying the current comprises:

connecting the transistor to a current mirror so that current to the node of the transistor mirrors current through a reference cell which is substantially identical to the transistor; and applying to a gate of the reference cell a voltage greater than a threshold voltage of the reference cell.

16. The method of claim 15, wherein applying the reference voltage comprises connecting a source or drain of the reference cell to the second input terminal of the differential amplifier.

17. The method of claim 13, wherein the first input terminal is a positive input terminal and the second input terminal is a negative input terminal.

18. The read circuit of claim 1, wherein the data value read is an analog value represented by a threshold voltage of the selected memory cell.

19. The read circuit of claim 1, wherein the data value read is a multi-bit digital value represented by a threshold voltage of the selected memory cell.

* * * * *